(12) United States Patent
Ono et al.

(10) Patent No.: US 8,981,237 B2
(45) Date of Patent: Mar. 17, 2015

(54) WIRING BOARD FOR ELECTRONIC PARTS INSPECTING DEVICE AND ITS MANUFACTURING METHOD

(75) Inventors: Tomoyoshi Ono, Nagoya (JP); Kazushige Akita, Nagoya (JP); Toshihisa Nomura, Kasugai (JP)

(73) Assignee: NGK Spark Plug Co., Ltd., Nagoya (JP)

( * ) Notice: Subject to any disclaimer, the term of this patent is extended or adjusted under 35 U.S.C. 154(b) by 309 days.

(21) Appl. No.: 13/414,317

(22) Filed: Mar. 7, 2012

(65) Prior Publication Data
US 2012/0228017 A1     Sep. 13, 2012

(30) Foreign Application Priority Data

Mar. 7, 2011   (JP) .................................. 2011-048639
Oct. 12, 2011  (JP) .................................. 2011-224720

(51) Int. Cl.
*H05K 1/11*    (2006.01)
*H05K 3/22*    (2006.01)
(Continued)

(52) U.S. Cl.
CPC ............... *G01R 1/0408* (2013.01); *G01R 3/00* (2013.01); *G01R 31/026* (2013.01)
USPC .................... 174/262; 29/851; 324/756.07

(58) Field of Classification Search
CPC ........... G01R 1/07335; G01R 1/07378; G01R 31/2889
USPC .................... 174/262; 29/851; 324/756.07
See application file for complete search history.

(56) References Cited

U.S. PATENT DOCUMENTS 5,258,330 A  * 11/1993 Khandros et al. ............... 29/593
5,258,648 A  * 11/1993 Lin .............................. 257/778
(Continued)

FOREIGN PATENT DOCUMENTS

| CN | 1171167 A | 1/1998 |
| CN | 1307793 A | 8/2001 |

(Continued)

OTHER PUBLICATIONS

The State Intellectual Property Office of P.R. China, Notification of First Office Action, issued in related Chinese Application No. 201210058762.8, issue date Sep. 26, 2014.
(Continued)

*Primary Examiner* — Jeremy C Norris
*Assistant Examiner* — Nathan Milakovich
(74) *Attorney, Agent, or Firm* — Stites & Harbison PLLC; Jeffrey A. Haeberlin; James R. Hayne

(57) ABSTRACT

A wiring board for an electronic parts inspecting device that can be designed and produced relatively quickly, inexpensively, and with a few number of jigs is provided. In certain embodiments the wiring board comprises a board main body having a front surface, a probe pad area having probe pads located in a central portion of the front surface, an outer connecting terminal area having outer connecting terminals located in a peripheral portion of the front surface, and wherein probe pads are connected to outer connecting terminals by front surface wirings formed between the probe pad area and the outer connecting terminal area. While certain embodiments further comprise inner wirings and first via conductors to connect the probe pads and outer connecting terminals, it is preferable to have no or a minimal amount of such inner wirings. Lastly, a method of manufacturing the same is provided.

15 Claims, 5 Drawing Sheets

(51) Int. Cl.
  *G01R 31/00* (2006.01)
  *G01R 31/28* (2006.01)
  *G01R 1/04* (2006.01)
  *G01R 3/00* (2006.01)
  *G01R 31/02* (2006.01)

(56) References Cited

U.S. PATENT DOCUMENTS

| | | | | |
|---|---|---|---|---|
| 5,550,406 | A * | 8/1996 | McCormick | 257/666 |
| 5,828,226 | A * | 10/1998 | Higgins et al. | 324/754.07 |
| 6,432,239 | B1 * | 8/2002 | Mandai et al. | 156/89.12 |
| 6,938,332 | B2 * | 9/2005 | Harada et al. | 29/830 |
| 7,459,795 | B2 * | 12/2008 | Eldridge et al. | 257/785 |
| 7,466,152 | B2 * | 12/2008 | Shioga et al. | 324/756.03 |
| 7,489,518 | B2 * | 2/2009 | Matsuda | 361/767 |
| 7,534,654 | B2 * | 5/2009 | Pedersen et al. | 438/110 |
| 7,550,844 | B2 * | 6/2009 | Matsuki et al. | 257/737 |
| 7,601,235 | B2 * | 10/2009 | Murata et al. | 156/89.12 |
| 7,833,370 | B2 * | 11/2010 | Kawamura et al. | 156/89.11 |
| 7,884,006 | B2 * | 2/2011 | Eldridge et al. | 438/611 |
| 7,884,632 | B2 | 2/2011 | Shiraishi et al. | |
| 7,898,276 | B2 * | 3/2011 | Williams et al. | 324/756.03 |
| 7,911,805 | B2 * | 3/2011 | Haba | 361/791 |
| 8,089,775 | B2 * | 1/2012 | Matsuda | 361/767 |
| 8,395,260 | B2 * | 3/2013 | Matsuki et al. | 257/737 |
| 2003/0003862 | A1 | 1/2003 | Yoshida et al. | |
| 2003/0010976 | A1 | 1/2003 | Grube et al. | |
| 2003/0025172 | A1 | 2/2003 | Grube et al. | |
| 2003/0168253 | A1 * | 9/2003 | Khandros et al. | 174/261 |
| 2006/0091510 | A1 * | 5/2006 | Liu et al. | 257/678 |
| 2006/0279300 | A1 * | 12/2006 | Khandros et al. | 324/754 |
| 2008/0129319 | A1 | 6/2008 | Beaman et al. | |
| 2008/0138576 | A1 * | 6/2008 | Nozu et al. | 428/138 |
| 2008/0138596 | A1 | 6/2008 | Yoshida et al. | |
| 2008/0272794 | A1 | 11/2008 | Grube et al. | |
| 2009/0039906 | A1 | 2/2009 | Yamada et al. | |
| 2009/0206861 | A1 | 8/2009 | Shiraishi et al. | |
| 2009/0321114 | A1 * | 12/2009 | Takahashi et al. | 174/257 |
| 2010/0065963 | A1 | 3/2010 | Eldridge et al. | |
| 2010/0103634 | A1 * | 4/2010 | Funaya et al. | 361/761 |
| 2010/0308854 | A1 * | 12/2010 | Garabedian et al. | 324/756.03 |
| 2012/0081140 | A1 * | 4/2012 | Shim et al. | 324/755.03 |
| 2012/0229160 | A1 * | 9/2012 | Ono et al. | 324/756.07 |
| 2012/0247821 | A1 * | 10/2012 | Nomura et al. | 174/258 |
| 2012/0306523 | A1 * | 12/2012 | Kwon et al. | 324/755.01 |
| 2013/0265073 | A1 * | 10/2013 | Nakano et al. | 324/754.07 |

FOREIGN PATENT DOCUMENTS

| | | |
|---|---|---|
| CN | 1390075 A | 1/2003 |
| CN | 101256202 A | 9/2008 |
| CN | 101346813 A | 1/2009 |
| EP | 0520841 A1 | 12/1992 |
| EP | 0795200 B1 | 9/1997 |
| JP | H07-058241 A | 3/1995 |
| JP | H09-186453 A | 7/1997 |
| JP | 2008-197118 A | 8/2008 |

OTHER PUBLICATIONS

USPTO, Notice of Allowance and Fees Due, dated Dec. 17, 2014, in related U.S. Appl. No. 13/414,343.

USPTO, Office Action dated Aug. 19, 2014, in related U.S. Appl. No. 13/414,343.

The State Intellectual Property Office of P.R. China, First Office Action, issued in corresponding Chinese Application No. 201210058936.0, issue/mail date Sep. 2, 2014.

* cited by examiner

WIRING BOARD FOR ELECTRONIC PARTS INSPECTING DEVICE AND ITS MANUFACTURING METHOD

CROSS REFERENCE TO RELATED APPLICATIONS

The present invention claims priority from Japanese Patent Application No. 2011-048639, which was filed on Mar. 7, 2011, and Japanese Patent Application No. 2011-224720, which was filed on Oct. 12, 2011, the disclosures of which are herein incorporated by reference in its entirety.

BACKGROUND OF THE INVENTION

1. Field of the Invention

The present invention relates to a wiring board for an electronic parts inspecting device, which is used for inspecting the electric conductivity or other property of an electronic part, and its manufacturing method.

2. Description of Related Art

In order to inspect the electric conductivity or other property of an electronic part, such as an IC chip or an LSI, a probe card is proposed in which a plurality of signal pads are formed for attaching a probe to a part near a central part on a front surface of a board made of a non-electrically conductive material, such as ceramics. A plurality of inner wirings (signal vias) are individually laid which expand toward a plurality of terminals substantially uniformly provided on an entire part of a back surface of the board from the signal pads in the directions of outer side surfaces along the direction of thickness of the back surface side from the front surface side. For instance, see Japanese Patent Application No. 2008-197118.

However, when the inner wirings are provided as in the above probe card, since the inner wirings need to be designed which respectively correspond to electronic parts to be inspected between layers of a multi-layer ceramic board, it is time consuming to design such a multi-layer ceramic board and a jig is required for forming via conductors or the inner wirings at prescribed positions for each ceramic layer. Accordingly, a problem arises that multi-layer ceramic boards cannot be manufactured and delivered in a short amount of time.

BRIEF SUMMARY OF THE INVENTION

It is an object of the present invention to provide a wiring board for an electronic parts inspecting device which can solve the problems described in the Background, such as shortening the time required to design and produce the wiring board, and that can be easily manufactured with a relatively small number of processes and jigs.

A means (Means 1) for solving the above-described problems has been conceived that forms probe pads and outer connecting terminals for electrically conducting with a base board on the same surface of a board main body, and that connects the terminals and the probe pads with front surface wirings.

That is, embodiments of the present invention provide a wiring board for an electronic parts inspecting device, comprising: a board main body having a front surface (front surface side) and a back surface (back surface side), at least the front surface being formed with an insulating layer; a probe pad area, in which a plurality of probe pads are formed, located in a central portion (side) of the front surface of the board main body; and an outer connecting terminal area, in which a plurality of outer connecting terminals are formed, located in a peripheral portion (side) of the front surface of the board main body; wherein the peripheral portion surrounds (is outside) the central portion, and the probe pads are connected (conducted) to the outer connecting terminals by front surface wirings formed between the probe pad area and the outer connecting terminal area.

According to embodiments of the present invention, since the probe pad area is located on the central portion of the front surface of the board main body and the outer connecting terminal area is located on the peripheral portion of the same front surface, it is only necessary to form the front surface wirings for connecting the probe pads to the outer connecting terminals on the front surface of the board main body. Consequently, in the wiring board, since inner wirings are not necessary and only the front surface wirings are required, the time necessary for designing and manufacturing inspecting circuits for inspecting electronic parts can be shortened. Accordingly, the wiring board for the electronic parts inspecting device can be provided which can precisely and rapidly carry out a prescribed inspection required for each of the electronic parts, can be designed in a short time, and can be easily manufactured by a small number of processes and jigs relatively inexpensively.

The board main body includes a structure in which most of the board main body, including the back surface in the direction of thickness, is formed with a metal core board, and two or more relatively thin insulating layers are laminated only in the front surface. The board main body may also include a structure only formed with a single or a plurality of layers of an insulating material, such as ceramics or a resin.

Further, the probe pads, the outer connecting terminals, and the front surface wirings formed on the front surface of the board main body may include a thin film layer formed on the front surface such that the insulating layer on the front surface side of the board main body is made of the ceramics.

Further, the front surface wirings formed on the front surface of the board main body include a wiring for a signal circuit to which a processing signal for an inspected electronic part is supplied, a wiring for a power circuit for feeding a power, and a wiring for a ground circuit connected to a ground. Accordingly, to the front surface wirings, chip shaped electronic parts such as a resistor, a capacitor or a diode are connected.

In addition thereto, from a plane view the outer connecting terminal area may have a substantially tubular square shape so as to surround an entire periphery of the probe pad area, which is located in the central portion of the front surface and has a substantially rectangular shape from a plane view on the front surface of the board main body that also has a substantially rectangular shape in plane view. The outer connecting terminal may also form a shape of U in plane view in which the outer connecting terminals are formed along three sides on the front surface so as to surround the probe pad area, or it may also form two independent rectangular shapes in plane view in which the outer connecting terminals are formed respectively in two rectangular areas along two opposed sides that sandwich the probe pad area.

Embodiments of the present invention also include a wiring board for an electronic parts inspecting device, wherein the board main body includes two insulating layers having inner wirings therebetween and first via conductors passing through the insulating layer of the front surface side; the two insulating layers are located on the front surface side of the board main body; and wherein one or more of the probe pads are electrically connected to one or more of the outer connecting terminals through the inner wirings and the first via conductors.

According to embodiments of the present invention, only in a case where the front surface wirings that connect the plurality of probe pads in the central portion on the front surface of the board main body to the plurality of outer connecting terminals in the peripheral portion inevitably intersect with each other when observed from a plane view is it necessary to have inner wirings and first via conductors. Preferably, a minimum number of such inner wirings and first via conductors are utilized. Thus, the wiring board for the electronic parts inspecting device mainly having the front surface wirings and partly having the inner wirings can be assuredly designed and manufactured in a short span of time.

Embodiments of the present invention also includes a wiring board for an electronic parts inspecting device, wherein the wiring board is mounted on an interposer made of an insulating material and having a front surface and a back surface, the back surface of the board main body facing the front surface of the interposer, the interposer including: a plurality of second via conductors passing between the front surface and the back surface of the interposer, and first terminals on the front surface and second terminals on the back surface that are individually connected to both ends of the respective second via conductors, wherein the second terminals are electrically connected (conducted) to an external part.

According to the present invention, the outer connecting terminals located in the peripheral portion of the front surface of the board main body are electrically connected to the first terminals located on the front surface of the interposer by bonding wires, and can securely be electrically connected to a mother board, such as a printed circuit board, on which the interposer is mounted through the second via conductors and the second terminals of the interposer.

When the wiring board for the electronic parts inspecting device is mounted on the front surface of the interposer, both the wiring board and the interposer are bonded to each other through a bonding agent or the back surface side of the wiring board is inserted into a recessed part formed on the front surface of the interposer.

Further embodiments of the interposer include second via conductors, first terminals on a front surface, and second terminals (outer terminals) on a back surface that are substantially uniformly arranged in plane view or are in a form in which the via conductors and the terminals are respectively formed only in peripheral portions of the front surface and the back surface of a interposer. A previously manufactured interposer may be used.

Embodiments of the present invention also include a wiring board for an electronic parts inspecting device, wherein the outer connecting terminals are connected to the first terminals with bonding wires or connectors.

According to embodiments of the present invention, in the wiring board for the electronic parts inspecting device or the interposer, inner wirings are not provided or the minimum number of inner wirings may be provided on the front surface of the inspecting device's wiring board. All or most of inspecting circuits are formed by the front surface wirings formed on the front surface of the wiring board for the inspecting device. Further, since a plurality of probes respectively standing upright on the probe pads, they hardly interfere with the bonding wires and the probes can securely come into contact with outer terminals of the parts to be inspected to ensure a precise inspection.

Accordingly, when the electronic parts to be inspected are inspected, the wiring board for the electronic parts inspecting device can be designed and manufactured in a relatively short time and can be accurately and practically utilized.

Meanwhile, embodiments of the present invention provide a method of manufacturing a wiring board for an electronic parts inspecting device, the wiring board including a board main body having a front surface and a back surface, at least the front surface being formed with an insulating layer, a probe pad area in which a plurality of probe pads are formed located in a central portion (side) of the front surface, an outer connecting terminal area in which a plurality of outer connecting terminals are formed located in a peripheral portion (side) of the front surface that surrounds the central portion, and front surface wirings connecting the probe pads to the outer connecting terminals, the method of manufacturing the wiring board comprising: sintering a green sheet having a front surface and a back surface to form a ceramic sheet, the green sheet having a plurality of board areas, and forming the plurality of probe pads, the plurality of outer connecting terminals, and the plurality of front surface wirings by applying a physical vapor deposition or a plating process to a front surface of the plurality of board areas to form a plurality of the wiring boards.

According to embodiments of the present invention, since the probe pads, the connecting terminals, and the front surface wirings are formed by applying the physical vapor deposition method only to the surface of the ceramic sheet obtained by sintering the green sheet, the time necessary for design or production can be shortened and the wiring board can be easily and inexpensively manufactured with a relatively small number of processes and jigs.

The physical vapor deposition process (method) (PVD) is a process for heating and evaporating metal particulates in vacuum to form a thin film, and includes, for instance, a vapor deposition by electron beam heating, laser heating, or spattering by an ion beam.

Further, in order to manufacture the wiring board for the electronic parts inspecting device having the inner wirings and the first via conductors, after a green sheet of an upper layer side which the first via conductors are previously penetrated and a green sheet of a lower layer side having the inner wirings formed on a front surface thereof are laminated, the above-described processes are respectively applied thereto, so that the wiring board is manufactured.

Further, after the wiring board for the electronic parts inspecting device is mounted on the front surface of the interposer, bonding wires are provided respectively between the outer connecting terminals and the first terminals. Thus, the practical wiring board for the electronic parts inspecting device can be formed.

Further embodiments of the present invention also include a method of manufacturing a wiring board for an electronic parts inspecting device, further comprising dividing the ceramic sheet to separate the plurality of wiring boards after forming the probe pads, the outer connecting terminals, and the front surface wirings on the front surface of the plurality of board areas.

According to embodiments of the present invention, the plurality of wiring boards for the electronic parts inspecting devices can be efficiently provided in a relatively short period. The ceramic sheet is divided into the individual wiring boards by cutting the ceramic sheet along recessed V-shaped grooves formed on the front surface of the ceramic sheet by a recessing method or shearing along a surface to be cut.

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE INVENTION

An exemplary embodiment for carrying out the present invention will be described below.

Figure 1:
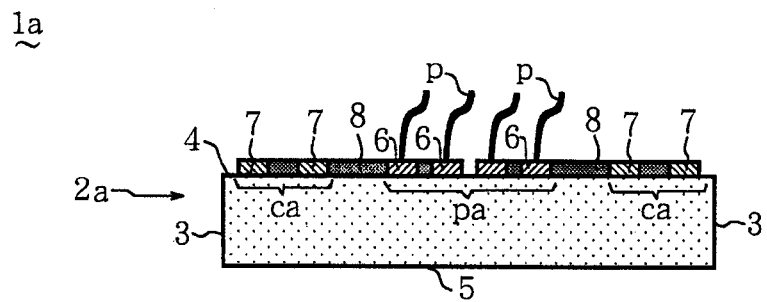
FIG. 1 is a front view showing a wiring board for an electronic parts inspecting device according one exemplary embodiment of the present invention.
Figure 2:
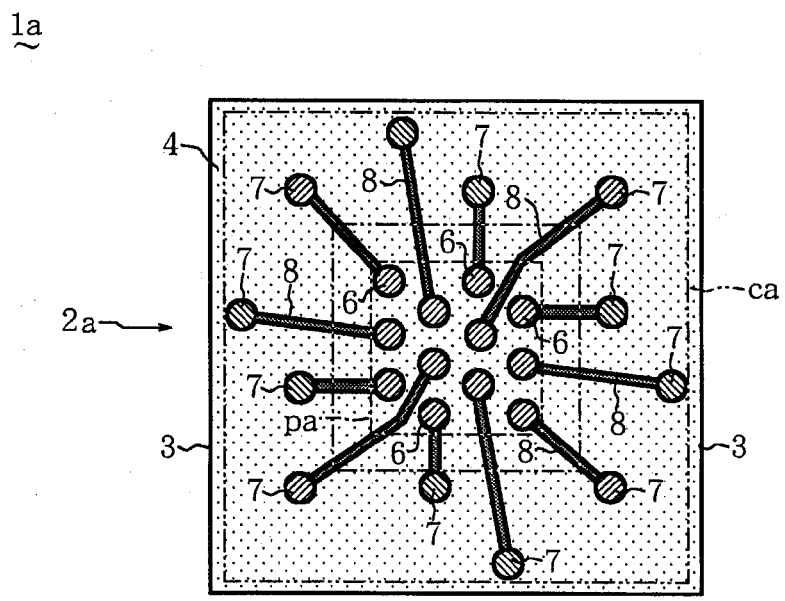
FIG. 2 is a plane view showing the wiring board for the electronic parts inspecting device.
Figure 3:
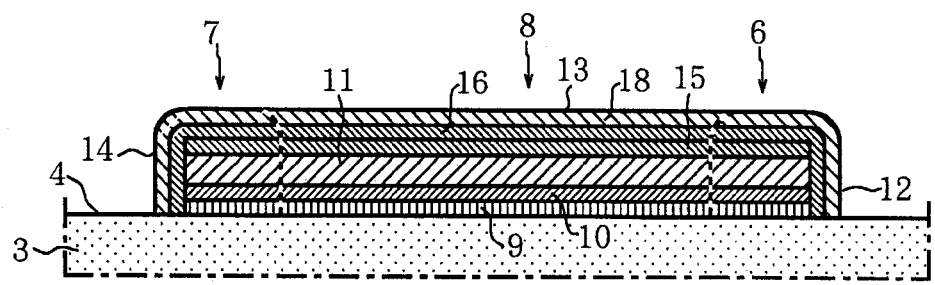
FIG. 3 is an enlarged vertical sectional view showing a portion of the wiring board in the vicinity of the front surface.

FIG. 1 is a front view (a side view) showing a wiring board for an electronic parts inspecting device (hereinafter "wiring board") 1a of one exemplary embodiment according to the present invention. FIG. 2 is a plane view of the wiring board 1a. FIG. 3 is an enlarged vertical sectional view part of the portion of the wiring board 1a in the vicinity of a front surface 4.

As shown in FIG. 1 and FIG. 2, the wiring board 1a includes a flat plate shaped board main body 2a made of high temperature sintered ceramics (e.g., an insulating material), such as alumina, having a front surface 4 and a back surface 5 substantially with a square (e.g., rectangular) shape from a plane view, a probe pad area pa in which a plurality of probe pads 6 are formed in a central side on the front surface 4 of the board main body 2a, an outer connecting terminal area ca located in a peripheral side of the front surface 4 in which a plurality of outer connecting terminals 7 are formed outside the probe pad area pa, and a plurality of front surface wirings 8 formed on the front surface 4 for individually connecting the probe pads 6 to the outer connecting terminals 7.

The board main body 2a is formed as a single ceramic layer or a laminated body having a plurality of ceramic layers and has side surfaces 3 for each of the four sides. The above-described ceramic layer may be formed with glass-ceramics, such as low temperature sintered ceramics.

The probe pad area pa has substantially a square shape from a plane view and the plurality of probe pads 6 protrude at substantially equal intervals. On the other hand, the outer connecting terminal ca has a substantially tubular square shape from a plane view so as to surround the probe pad area pa and the outer connecting terminals 7. As shown in FIG. 2, there may be the same number of outer connecting terminals 7 as the probe pads 6. The plurality of outer connecting terminals 7 may also be more than the probe pads 6, and may partly include an electrically independent outer connecting terminal.

As shown in FIG. 3 as an example, the probe pads 6, the front surface wirings 8 and the outer connecting terminals 7 are formed as described below. On the front surface 4 of the board main body 2a previously adjusted to be flat, a Ti thin film layer 9 and a Cu thin film layer 10 of prescribed patterns, including circular parts at both ends and intermediate linear parts from a plane view, are sequentially laminated by a spattering and photography technique. Then, a Cu plating layer 11 and an Ni plating layer 15 having similar forms from a plane view are formed on the Cu thin film layer 10 to form substantially cylindrical parts 12 and 14 at both ends and a linear part 13 in an intermediate part. Further, after a plating resist (not shown in the drawing) formed in the periphery of the Cu plating layer 11 and the Ni plating layer 15 is removed, an outer side surface of the above-described Ti thin film layer 9, the Cu thin film layer 10 and the Cu plating layer 11 is sequentially coated with an Ni plating layer 16 and an Au plating layer 18 respectively by an electrolytic plating process.

The front surface wiring 8 may partly include a curved part from a plane view. Further, the front surface wirings 8 include a wiring for a signal circuit to which a processing signal for inspecting an electronic parts to be inspected is supplied, a wiring for a power circuit for feeding a power, and a wiring for a ground circuit connected to a ground (none shown).

Figure 4:
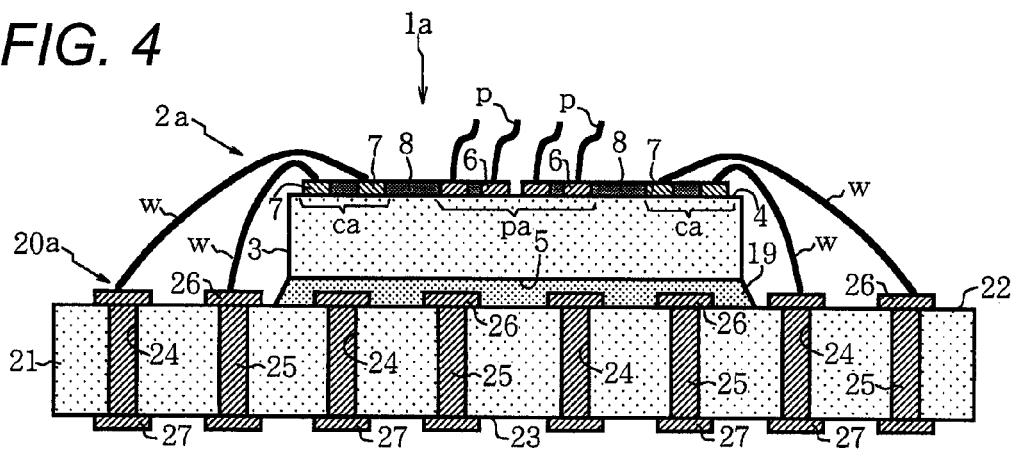
FIG. 4 is a vertical sectional view showing the wiring board mounted on a front surface of an interposer.

FIG. 4 is a vertical sectional view showing the wiring board 1a mounted on an upper part of a front surface 22 of an interposer 20a.

As shown in FIG. 4, the interposer 20a is made of the high temperature sintered ceramics (the insulating material), such as alumina, and includes a board main body 21 having a front surface 22 and a back surface 23 with substantially square forms from a plane view, a plurality of second via conductors 25 formed respectively for a plurality of via holes 24 passing through at substantially equal intervals between the front surface 22 and the back surface 23 of the board main body 21, a plurality of first terminals 26 respectively connected to end parts of the second via conductors 25 in the front surface 22 side, and a plurality of outer terminals 27 respectively connected to end parts of the second via conductors 25 in the back surface 23 side that are used to electrically conduct to an external part.

When the board main body 21 is formed with alumina, the second via conductors 25, the first terminals 26, and the outer terminals 27 are mainly formed with W or Mo. When the board main body 21 is formed with glass-ceramics, such as low temperature sintered ceramics (the insulating material), the second via conductors 25, the first terminals 26, and the outer terminals 27 are formed with Cu or Ag.

As shown in FIG. 4, the probes p are attached to stand upright to the upper parts of the probe pads 6, and may come into electrical contact with a plurality of electronic parts (none shown in the drawing) to be inspected that are provided together with, for instance, Si wafers. Further, to a central part of the front surface 22 of the interposer 20a, the back surface 5 side of the wiring board 1a is bonded with a bonding agent 19, so that the wiring board 1a is mounted on the surface 22 of the interposer 20a. Further, the first terminals 26 located in a periphery of the front surface 22 of the interposer 20a are individually connected to the outer connecting terminals 7 of the wiring board 1a later by bonding wires w. Thus, the second terminals 27 can be individually electrically connected to the probes p. As a result, the plurality of electronic parts to be inspected can be continuously inspected.

Since the interposer 20a has an ordinary form, an existing interposer may be made used for embodiments of the present invention.

Figure 5:
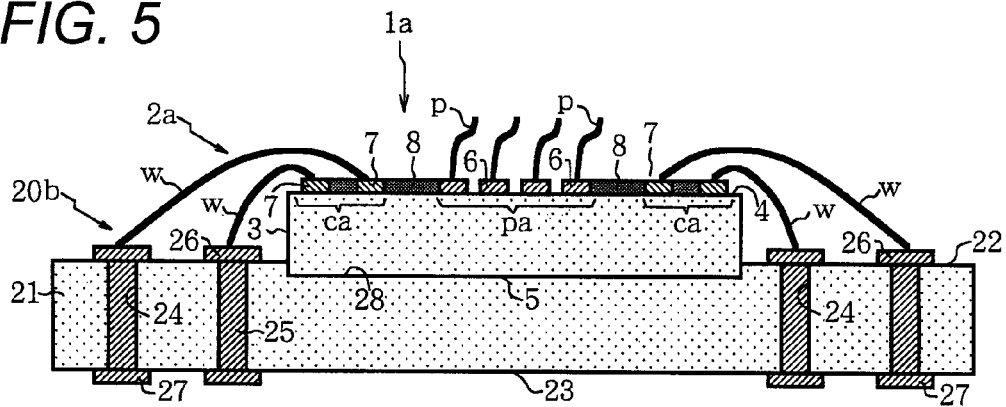
FIG. 5 is a vertical sectional view showing a different mounting of the wiring board on the interposer.

FIG. 5 is a vertical sectional view showing the wiring board 1a mounted on a front surface 22 side of a interposer 20b having a different form. As shown in FIG. 5, the interposer 20b includes a board main body 21 similar to the above-described board main body, a plurality of second via conductors 25 which pass through only a peripheral side of a front surface 22 and a back surface 23 of the board main body 21, first terminals 26 in the front surface 22 side and second terminals 27 in the back surface 23 side which are individually connected to both ends of the via conductors 25, and a recessed part 28 having a rectangular form from a plane view and an upwardly facing opening in a central part of the front surface 22.

As shown in FIG. 5, after the back surface 5 side of the wiring board 1a is inserted into the recessed part 28 of the interposer 20b so that the wiring board 1a is mounted on the front surface 22 side of the interposer 20b, the probes p are allowed to stand upright respectively on upper parts of the probe pads 6 as described above, and the first terminals 26 located in the front surface 22 side of the interposer 20b are individually connected to the outer connecting terminals 7 of the wiring board 1a by bonding wires w. Thus, the second terminals 27 can be individually electrically connected to the probes p. As a result, the plurality of electronic parts to be inspected can be continuously inspected. The interposer 20b may be previously manufactured.

According to the above-described wiring board 1a, since the probe pad area pa is formed in which the plurality of probe pads 6 are located in the central side on the front surface 4 of the board main body 2a and the outer connecting terminal area ca is formed in which the plurality of outer connecting terminals 7 are located in the peripheral side on the same front surface 4, the front surface wirings 8 for connecting the pads 6 for the probes to the outer connecting terminals 7 can be formed to be only on the front surface 4 of the board main body 2a. Consequently, in the wiring board 1a, since inner wirings are not necessary and only the front surface wirings 8 are required, the time necessary for designing and manufacturing inspecting circuits respectively meeting the electronic parts to be inspected can be shortened. Accordingly, a wiring board 1a for the electronic parts inspecting device can be assuredly provided which can precisely and rapidly carry out a prescribed inspection required for each of the electronic parts, can be designed in a short time, can be easily manufactured with a small number of jigs, and is relatively inexpensive.

Figure 6:
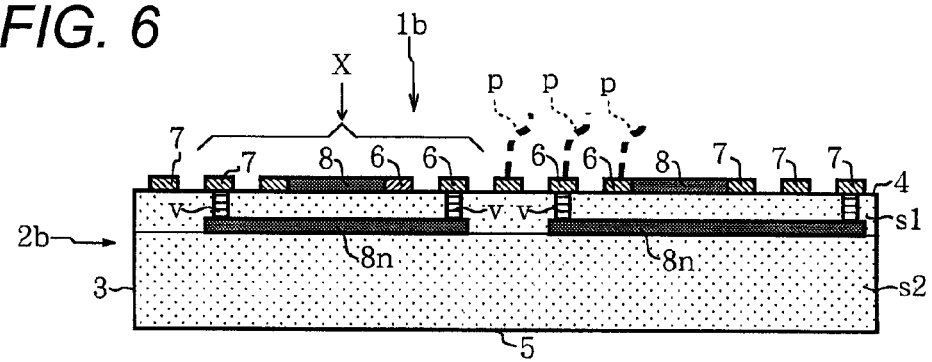
FIG. 6 is a vertical sectional view showing a wiring board for an electronic parts inspecting device according to a different exemplary embodiment.
Figure 7:
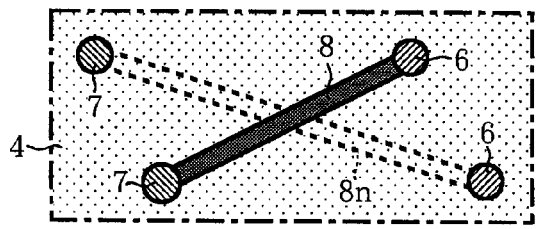
FIG. 7 is an enlarged plane view showing section X of FIG. 6.

FIG. 6 is a vertical sectional view showing a wiring board 1b of a different exemplary embodiment. FIG. 7 is a partly enlarged plane view of part X in FIG. 6.

As shown in FIG. 6 and FIG. 7, the wiring board 1b includes a board main body 2b in which a relatively thin ceramic layer s1 in a front surface 4 side and a relatively thick ceramic layer s2 including a back surface 5 are laminated, a probe pad area pa having a plurality of probe pads 6 formed on the front surface 4 of the board main body 2b in the same manner as described above, an outer connecting terminal area ca having a plurality of outer connecting terminals 7, front surface wiring 8 for connecting the pads 6 to the terminals 7, inner wirings 8n formed between the ceramic layers s1 and s2 and first via conductors v which individually connect end parts of the inner wirings 8n to the pads 6 or the connecting terminals 7 and pass through the ceramic layer s1 in the front surface 4 side.

Below is described why in the wiring board 1b, between the layers of the ceramic layers s1 and s2 located in the front surface 4 side of the board main body 2b, the inner wirings 8n and the first via conductors v are formed which pass through the ceramic layer s1. As shown in FIG. 7, when the plurality of front surface wirings 8 that connect the probe pads 6 to the outer connecting terminals 7 inevitably intersect with each other from a plane view, one should avoid the potential of the front surface wirings 8 short-circuiting.

The inner wirings 8n and the first via conductors v are mainly formed with W or Mo or also Cu or Ag depending on the material of the ceramic layers s1 and s2.

The wiring board 1b is also mounted on a front surface 22 side of interposers 20a and 20b in the same manner as described above. The probes p are respectively attached to upper parts of the probe pads 6 and the outer connecting terminals 7 are connected to first terminals 26 in the front surface 22 side of the interposers 20a and 20b through bonding wires w to be used for inspecting electronic parts.

According to the above-described wiring board 1b, where the front surface wirings 8 that connect the plurality of probe pads 6 to the plurality of outer connecting terminals 7 inevitably intersect with each other on the front surface 4 when viewed from a plane view, the minimum number of inner wirings 8n and first via conductors v are arranged. Thus, the wiring board for the electronic parts inspecting device mainly having the front surface wirings 8 including an inspecting circuit can be assuredly designed and manufactured in a short span of time.

Figure 8:
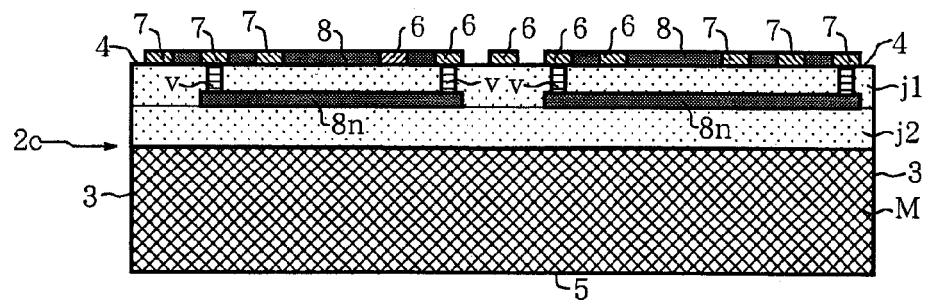
FIG. 8 is a vertical sectional view showing a wiring board for an electronic parts inspecting device according to a further different exemplary embodiment.

FIG. 8 is a vertical sectional view showing a wiring board 1c of a further different exemplary embodiment.

As shown in FIG. 8, the wiring board 1c includes a board main body 2c including a relatively thick metal core board M and resin layers (e.g., insulating layers) j1 and j2 made of epoxy resin formed on an upper surface of the thick metal core board M, probe pads 6, outer connecting terminals 7, and front surface wirings 8 formed on a front surface 4 of the board main body 2c in the same manner as described above, inner wirings 8n formed between the layers of the resin layers j1 and j2 in the front surface 4 side of the board main body 2c in the same manner as described above, and first via conductors v which individually connect end parts of the inner wirings 8n to the probe pads 6 or the outer connecting terminals 7 and pass through the resin layer j1 in the front surface 4 side in the same manner as described above. The probe pads 6, the outer connecting terminals 7, and the surface wirings 8 are formed with a Cu plating film and can be precisely formed at fine pitches by a photolithography technique such as a subtractive method.

The same effects as those discussed with regard to the wiring board 1b can be achieved by the above-described wiring board 1c.

The board main body 2b of the wiring board 1b may be utilized instead of the board main body 2c.

Figure 9:
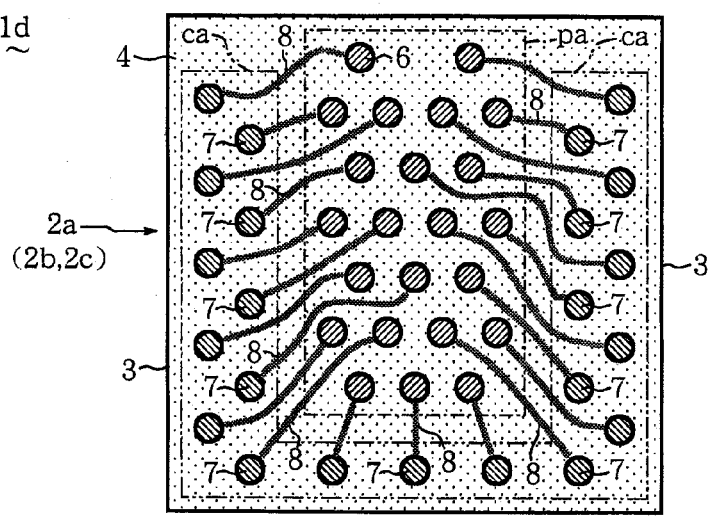
FIG. 9 is a plane view showing a wiring board for an electronic parts inspecting device according to a further different exemplary embodiment.

FIG. 9 is a plane view of a wiring board 1d of a further different exemplary embodiment. In the wiring board 1d, as shown in FIG. 9, on a front surface 4 of the same board main body 2a as described above which has a substantially square form from a plane view, a pad area pa in a central side having a plurality of probe pads 6 and a rectangular form from a plane view is located so as to come close to only one side of the front surface 4 (an upper side). A plurality of outer connecting terminals 7 is formed and an outer connecting terminal area ca substantially having a shape of U from a plane view is located along three sides on the front surface 4. The connecting terminal area ca is located outside the pad area pa and surrounds the pad area pa from three sides.

The board main body 2a may be formed as the above-described board main bodies 2b and 2c in which a part of front wirings 8 is replaced by inner wirings 8n and a pair of first via conductors v.

Figure 10:
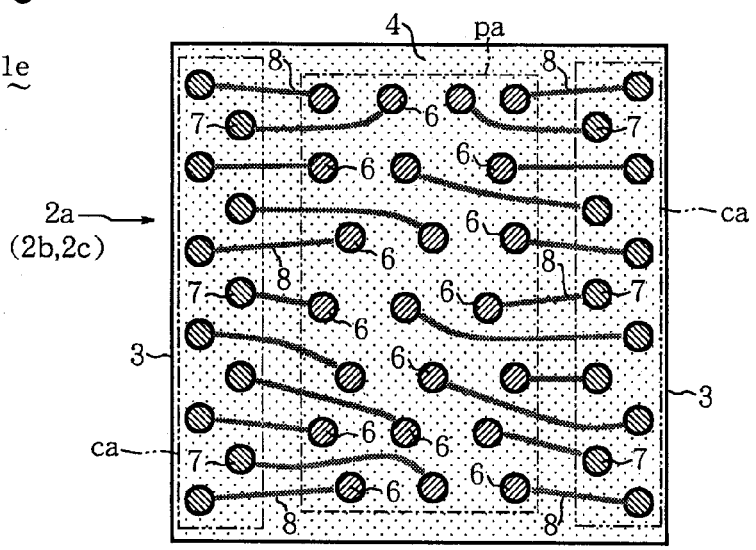
FIG. 10 is a plane view showing a wiring board for an electronic parts inspecting device according to a still further different exemplary embodiment.

FIG. 10 is a plane view showing a wiring board 1e of a still further different exemplary embodiment.

In the wiring board 1e, as shown in FIG. 10, on a front surface 4 of the same board main body 2a as described above which has a substantially square form from a plane view, a pad area pa in a central side having a plurality of probe pads 6 and a rectangular form from a plane view is located in a central part between two opposed sides and has end parts that come close to parts near two remaining sides. One pair of right and left outer connecting terminal areas ca in which outer connecting terminals 7 are formed are located in peripheral sides along the two sides that oppose the probe pad area pa. The pair of outer connecting terminal areas ca have relatively elongated rectangular forms from a plane view and are located outside the pad area pa to hold the pad area pa from both sides. The above-described board main body 2a may be also formed as the above-described board main bodies 2b and 2c in which a part of front wirings 8 is replaced by inner wirings 8n and a pair of first via conductors v.

Now, a method of manufacturing the wiring board 1a will be described below.

Figure 11:
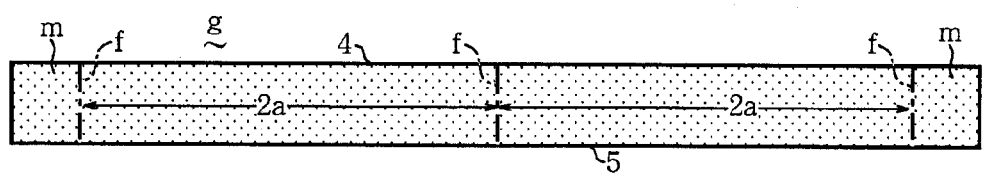
FIG. 11 is a schematic sectional view showing a step in the production process of the wiring board for the electronic parts inspecting device.

Suitable amounts of a resin binder and solvent are previously mixed with alumina powder to obtain a ceramic slurry. The ceramic slurry is changed to a sheet by a doctor blade method to manufacture a green sheet g that is a single layer having a front surface 4 and a back surface 5 as shown by a sectional view in FIG. 11. A dashed line shown in FIG. 11 shows a virtual surface to be cut (a boundary) f that is a grid shape from a plane view. Between the virtual surfaces f, board areas 2a which will become wiring boards 1a are located, and a frame shaped lug part m is located outside the virtual surfaces f.

Figure 12:
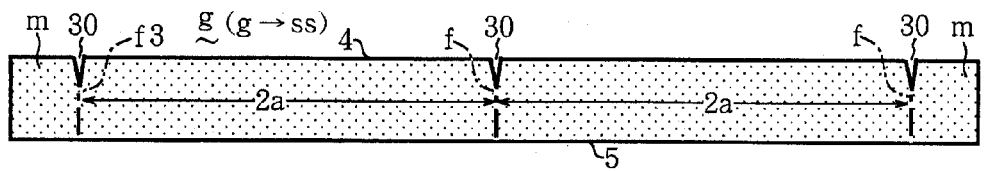
FIG. 12 is a schematic sectional view showing a step in the production process subsequent to that shown in FIG. 11.

Then, as shown in FIG. 12, a grooving work for inserting a cutting edge side of a knife (not shown in the drawing) is applied along the surface f to be cut, which is exposed on the front surface 4 side of the green sheet g to form a V-shaped recessed groove 30 in a grid pattern, when viewed from a plane view. Then, the green sheet g having the recessed groove 30 formed on the front surface 4 is sintered at a prescribed temperature to obtain a ceramic sheet ss.

Figure 13:
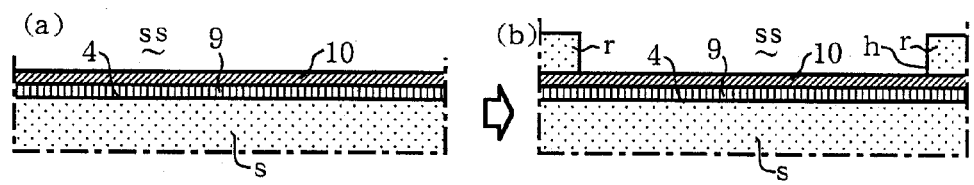
FIG. 13 is a schematic sectional view showing a step in the production process subsequent to that shown in FIG. 12.

Further, as shown by the enlarged sectional view of FIG. 13(a), the front surface 4 of each board area 2a is smoothed. A spattering process (e.g., a physical vapor deposition method) by an ion beam is applied to the entire surface of the front surface 4 to sequentially coat the front surface 4 with a Ti thin film layer 9 and a Cu thin film layer 10. Then, as shown in FIG. 13(b), after a resist layer r made of a photosensitive resin is formed on an entire surface of the Cu thin film layer 10, a photolithography technique is applied to the resist layer r to form a plurality of through holes h with elongated oval shapes from a plane view at prescribed positions. The through hole h may have a form when viewed from a plane view which has circular parts at both ends and a linear part for connecting the circular parts.

Figure 14:
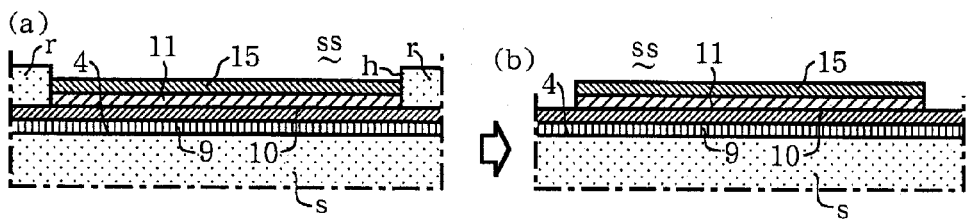
FIG. 14 is a schematic sectional view showing a step in the production process subsequent to that shown in FIG. 13.

Subsequently, as shown in FIG. 14(a), two kinds of electrolytic metal plating processes are sequentially applied to the Cu thin film layer 10 exposed on a bottom surface of the through hole h to sequentially coat the Cu thin film layer with a Cu plating layer 11 and Ni plating layer 15. Then, as shown in FIG. 14(b), the resist layer r is allowed to come into contact with developing solution, is peeled off, and is removed. Further, as shown in FIG. 15(a), parts of the Ti thin film layer 9 and the Cu thin film layer 10 which are not coated with the Cu plating layer 11 and the Ni plating layer 15 are allowed to come into contact with etching liquid and are removed.

Figure 15:
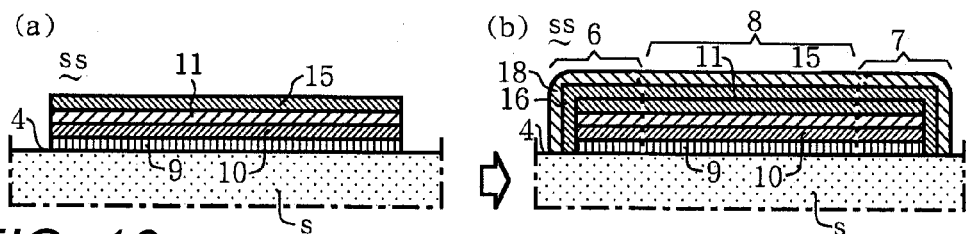
FIG. 15 is a schematic sectional view showing a step in the production process subsequent to that shown in FIG. 14.

Then, two kinds of non-electrolytic plating processes are sequentially applied to the Ti thin film layer 9, the Cu thin film layer 10, the Cu plating layer 11, and the Ni plating layer 15 that generally have the elongated oval shape from a plane view to sequentially apply thereto an Ni plating layer 16 having the thickness of about 1 to several μm and an Au plating layer 18 having the thickness of about 0.03 to 0.1 μm as shown in FIG. 15(b). As a result, a probe pad, an outer connecting terminal 7, and a surface wiring 8 is formed which is integrally formed and generally has the elongated oval shape. As shown by a broken line in FIG. 15(b), the pad 6 and the terminal 7 may have circular shapes from a plane view and the pad 6 may be connected to the terminal 7 by the linear front surface wiring 8.

Figure 16:
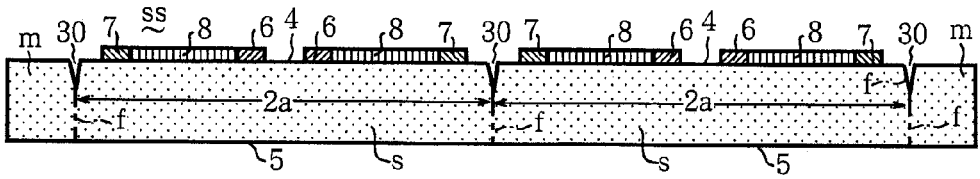
FIG. 16 is a schematic sectional view showing a step in the production process subsequent to that shown in FIG. 15.

Consequently, as shown in FIG. 16, on the front surface 4 of each board area 2a (the wiring board 1a) of the ceramic sheet ss for manufacturing many wiring boards, there are formed the plurality of probe pads 6 located in a central side pa, the plurality of outer terminals 7 located in a peripheral side ca, and the front surface wirings 8 for individually connecting them together.

Figure 17:
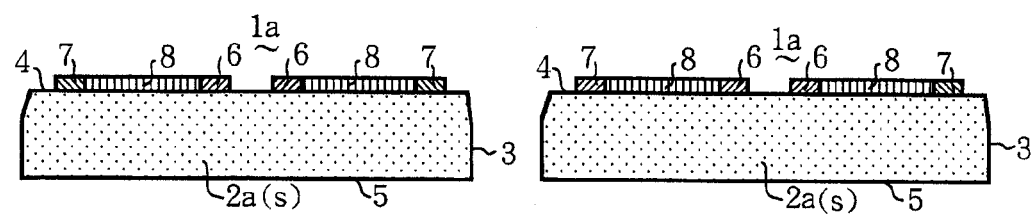
FIG. 17 is a schematic sectional view showing a step in the production process subsequent to that shown in FIG. 16.

Further, the ceramic sheet ss is divided along the recessed grooves 30 shown in FIG. 16 to form the individual wiring boards 1a. Thus, as shown in FIG. 17, the wiring board 1a can be obtained which has the probe pads 6, the outer connecting terminals 7, and the front surface wirings 8 on the front surface 4 of each board main body 2a.

Then, as shown in FIG. 4, after the wiring board 1a is mounted on the front surface 22 of the interposer 20a through the bonding agent 19 or on the front surface 22 of the interposer 20b by inserting the back surface 5 side into the recessed part 28 located on the front surface 22 of the interposer 20b, the bonding wires w are individually attached respectively between the outer connecting terminals 7 of the wiring boards 1a and the first terminals 26 of the interposers 20a and 20b.

In order to obtain the above-described wiring board 1b, green sheets g of two layers having different thickness are prepared. A process is carried out in which a first unsintered via conductor v is allowed to pass through the green sheet g of the upper layer, and an electrically conductive paste as an inner wiring 8n is formed on the surface of the green sheet g of the lower layer, and then these layers are laminated. Subsequently, the above-described processes are respectively carried out so that the wiring board 1b to be mounted can be manufactured.

Further, when the above-described metal core board M is added to the above-described green sheets g of the two layers, the above-described wiring board can be manufactured.

Further, in place of a spattering process by ion beam, a vapor deposition method by electron beam heating or laser heating may be used.

In addition thereto, the individual wiring boards 1a to 1c may be separately formed by shearing along the surfaces f to be cut without forming the recessed grooves 30.

According to the method of manufacturing the wiring boards 1a to 1c as described above, since the spattering process is applied only to the front surface 4 of the ceramic sheet ss obtained by sintering the green sheet g to form the probe pads 6, the outer connecting terminals 7 and the front surface wirings 8, the time necessary for designing and/or producing the wiring board 1a to 1c can be shortened and the wiring board can be easily and inexpensively manufactured with a relatively small number of processes and jigs.

The present invention is not limited to the above-described exemplary embodiments.

For instance, the wiring board may have the board main body made of a resin, such as an epoxy resin. In this case, the probe pads 6, the outer connecting terminals 7, the front surface wirings 8, the inner wirings 8n, or the first via conductors v are mainly formed with Cu. Further, the outer connecting terminals of the wiring board may be connected to the first terminals of the interposer by connectors, rather than bonding wires. Thus, between the plurality of outer connecting terminals and the first terminals, either bonding wires or the connectors may be selected to connect the terminals, depending on the parts to be connected. Further, the front surfaces and the back surfaces of the wiring board as well as the board main body of the interposer having the front surface on which the wiring board is mounted may be formed in rectangular shapes from a plane view.

Further, a interposer on which one wiring board is mounted may have a form in which two or more upper and lower layers are laminated, and an outer connecting terminal of the wiring board may be individually connected to a first terminal of the interposer having the two upper and lower layers by bonding wires or connectors.

Further, a plurality of wiring boards may be mounted on different and mutually separated positions of the front surface of one board having a relatively large area or on the front and back surfaces thereof.

In addition thereto, the probe pad area may be formed in the shape of a polygon having six or more sides, a circular shape, an oval shape, or an elliptic shape from a plane view in a central side of the front surface of the wiring board, and an outer connecting terminal area may be arranged in the peripheral side of a front surface adjacent to either the entire or only a part of the periphery thereof.

According embodiments of to the present invention, a wiring board for a electronic parts inspecting device can be provided that requires a relatively shortened time for design and production and that can be easily manufactured with a relatively small number of jigs.

DESCRIPTION OF REFERENCE NUMERALS 1a to 1e: wiring board (wiring board for electronic parts inspecting device)
2a to 2c: board main body/board area
4: front surface of wiring board
5: back surface of wiring board
6: probe pad
7: outer connecting terminal
8: front surface wiring
8n: inner wiring
20a, 20b: interposer
22: front surface of interposer
23: back surface of interposer
25: second via conductor
26: first terminal
27: second terminal
pa: probe pad area
ca: outer connecting terminal area
v: first via conductor
s1, s2: ceramic layer (insulating layer)
j1, j2: resin layer (insulating layer)
w: bonding wire
g: green sheet
ss: ceramic sheet

What is claimed is:

1. A wiring board for an electronic parts inspecting device, comprising:
   a board main body having a front surface and a back surface, at least the front surface being formed with an insulating layer;
   a probe pad area, located in a central portion of the front surface of the board main body;
   a plurality of probe pads formed in the probe pad area, the probe pads configured such that probes can be attached thereto; and
   an outer connecting terminal area, in which a plurality of outer connecting terminals are formed, located in a peripheral portion of the front surface of the board main body;
   wherein
   the peripheral portion surrounds the central portion such that all of the outer connecting terminals are located outside of the probe pad area, and
   the probe pads are connected to the outer connecting terminals by front surface wirings formed between the probe pad area and the outer connecting terminal area.

2. A wiring board for an electronic parts inspecting device according to claim 1,
   wherein the board main body includes two insulating layers having inner wirings therebetween and first via conductors passing through the insulating layer of the front surface side;
   the two insulating layers are located on the front surface side of the board main body;
   the front surface wirings are arranged above the inner wirings; and
   wherein one or more of the probe pads are electrically connected to one or more of the outer connecting terminals through the inner wirings and the first via conductors and not through the front surface wirings.

3. A wiring board for an electronic parts inspecting device according to claim 1,
   wherein the wiring board is mounted on an interposer made of an insulating material and having a front surface and a back surface, the back surface of the board main body facing the front surface of the interposer, the interposer including:
   a plurality of second via conductors passing between the front surface and the back surface of the interposer, and
   first terminals on the front surface and second terminals on the back surface that are individually connected to both ends of the respective second via conductors, wherein the second terminals are electrically connected to an external part.

4. A wiring board for an electronic parts inspecting device according to claim 3,
   wherein the outer connecting terminals are connected to the first terminals with bonding wires or connectors.

5. A wiring board for an electronic parts inspecting device according to claim 1, wherein the wiring board is inserted into a recessed part formed on a front surface of an interposer made of an insulating material and having the front surface and a back surface, the back surface of the board main body facing the front surface of the interposer, the interposer including:

a plurality of second via conductors passing between the front surface and the back surface of the interposer, and first terminals on the front surface and second terminals on the back surface that are individually connected to both ends of the respective second via conductors, wherein the second terminals are electrically connected to an external part.

6. A wiring board for an electronic parts inspecting device according to claim 5, wherein the outer connecting terminals are connected to the first terminals with bonding wires or connectors.

7. A method of manufacturing a wiring board for an electronic parts inspecting device, the wiring board including a board main body having a front surface and a back surface, at least the front surface being formed with an insulating layer, a probe pad area located in a central portion of the front surface, a plurality of probe pads formed in the probe pad area and configured such that probes can be attached thereto, an outer connecting terminal area in which a plurality of outer connecting terminals are formed, located in a peripheral portion of the front surface that surrounds the central portion, and front surface wirings connecting the probe pads to the outer connecting terminals, the method of manufacturing the wiring board comprising:

sintering a green sheet having a front surface and a back surface to form a ceramic sheet, the green sheet having a plurality of board areas; and forming the plurality of probe pads, the plurality of outer connecting terminals, and the plurality of front surface wirings by applying a physical vapor deposition and a plating process to a front surface of the plurality of board areas to form a plurality of the wiring boards.

8. The method of manufacturing a wiring board for an electronic parts inspecting device according to claim 7, further comprising:

dividing the ceramic sheet to separate the plurality of wiring boards after forming the probe pads, the outer connecting terminals, and the front surface wirings on the front surface of the plurality of board areas.

9. A wiring board for an electronic parts inspecting device according to claim 2, wherein a first of the plurality of probe pads is connected to a first of the plurality of outer connecting terminals by one of the front surface wirings and a second of the plurality of probe pads is connected to a second of the plurality of outer connecting terminals by one of the inner wirings such that the one of the front surface wirings crosses the one of the inner wirings when viewed from a plan view.

10. A wiring board for an electronic parts inspecting device, comprising:

a board main body having a front surface and a back surface, at least the front surface being formed with an insulating layer;

a probe pad area, located in a central portion of the front surface of the board main body;

a plurality of probe pads formed in the probe pad area, the probe pads configured such that probes can be attached thereto; and an outer connecting terminal area, in which a plurality of outer connecting terminals are formed, located in a peripheral portion of the front surface of the board main body;

wherein the peripheral portion surrounds the central portion, wherein one or more of the probe pads are connected to the outer connecting terminals by front surface wirings formed between the probe pad area and the outer connecting terminal area, wherein the board main body includes two insulating layers having inner wirings therebetween and first via conductors passing through the insulating layer of the front surface side, wherein the two insulating layers are located on the front surface side of the board main body, wherein the front surface wirings are arranged above the inner wirings, and wherein one or more of the probe pads are electrically connected to one or more of the outer connecting terminals through the inner wirings and the first via conductors and not through the front surface wirings.

11. A wiring board for an electronic parts inspecting device according to claim 10, wherein the wiring board is mounted on an interposer made of an insulating material and having a front surface and a back surface, the back surface of the board main body facing the front surface of the interposer, the interposer including:

a plurality of second via conductors passing between the front surface and the back surface of the interposer, and first terminals on the front surface and second terminals on the back surface that are individually connected to both ends of the respective second via conductors, wherein the second terminals are electrically connected to an external part.

12. A wiring board for an electronic parts inspecting device according to claim 11, wherein the outer connecting terminals are connected to the first terminals with bonding wires or connectors.

13. A wiring board for an electronic parts inspecting device according to claim 10, wherein the wiring board is inserted into a recessed part formed on a front surface of an interposer made of an insulating material and having the front surface and a back surface, the back surface of the board main body facing the front surface of the interposer, the interposer including:

a plurality of second via conductors passing between the front surface and the back surface of the interposer, and first terminals on the front surface and second terminals on the back surface that are individually connected to both ends of the respective second via conductors, wherein the second terminals are electrically connected to an external part.

14. A wiring board for an electronic parts inspecting device according to claim 10, wherein the outer connecting terminals are connected to the first terminals with bonding wires or connectors.

15. A wiring board for an electronic parts inspecting device according to claim 10, wherein a first of the plurality of probe pads is connected to a first of the plurality of outer connecting terminals by one of the front surface wirings and a second of the plurality of probe pads is connected to a second of the plurality of outer connecting terminals by one of the inner wirings such that the one of the front surface wirings crosses the one of the inner wirings when viewed from a plan view.

* * * * *